(12) United States Patent
Feng et al.

(10) Patent No.: US 7,064,614 B2
(45) Date of Patent: Jun. 20, 2006

(54) CURRENT MIRROR BIASING CIRCUIT WITH POWER CONTROL FOR HBT POWER AMPLIFIERS

(75) Inventors: Jeffrey T. Feng, Urbana, IL (US); David Charles Caruth, Champaign, IL (US)

(73) Assignee: Xindium Technologies, Inc., Crystal Lake, IL (US)

( * ) Notice: Subject to any disclaimer, the term of this patent is extended or adjusted under 35 U.S.C. 154(b) by 52 days.

(21) Appl. No.: 10/888,198

(22) Filed: Jul. 9, 2004

(65) Prior Publication Data

US 2006/0006947 A1    Jan. 12, 2006

(51) Int. Cl.
*H03F 3/04* (2006.01)
(52) U.S. Cl. .................. 330/296; 330/288
(58) Field of Classification Search .......... 330/288, 330/296
See application file for complete search history.

(56) References Cited

U.S. PATENT DOCUMENTS

| 6,437,647 B1 * | 8/2002 | Fowler ............... 330/288 |
| 6,452,456 B1 * | 9/2002 | Gharpurey et al. ..... 330/296 |
| 6,750,721 B1 * | 6/2004 | Patterson ............ 330/295 |

* cited by examiner

*Primary Examiner*—Steven J. Mottola
(74) *Attorney, Agent, or Firm*—Brinks Hofer Gilson & Lione (57) ABSTRACT

An electronic circuit includes a current mirror bias circuit and a power amplifier that has a power transistor for amplifying radio frequency signals such that the output collector current of the power transistor is approximately constant over a wide range of varying power supply voltages. The power transistor is biased by a current mirror biasing circuit that has a reference voltage that maintains the quiescent DC collector current at an approximately constant value. The reference voltage may be varied to provide control of the output power of the power amplifier.

14 Claims, 8 Drawing Sheets

PRIOR ART

Prior Art

Figure 4

Prior Art

CURRENT MIRROR BIASING CIRCUIT WITH POWER CONTROL FOR HBT POWER AMPLIFIERS

BACKGROUND

1. Technical Field

This invention relates to constant current sources for power amplifiers, and more particularly, to a current mirror biasing circuit that provides a constant quiescent collector current for a power transistor over a varying collector supply voltage.

2. Background Information

Figure 1:
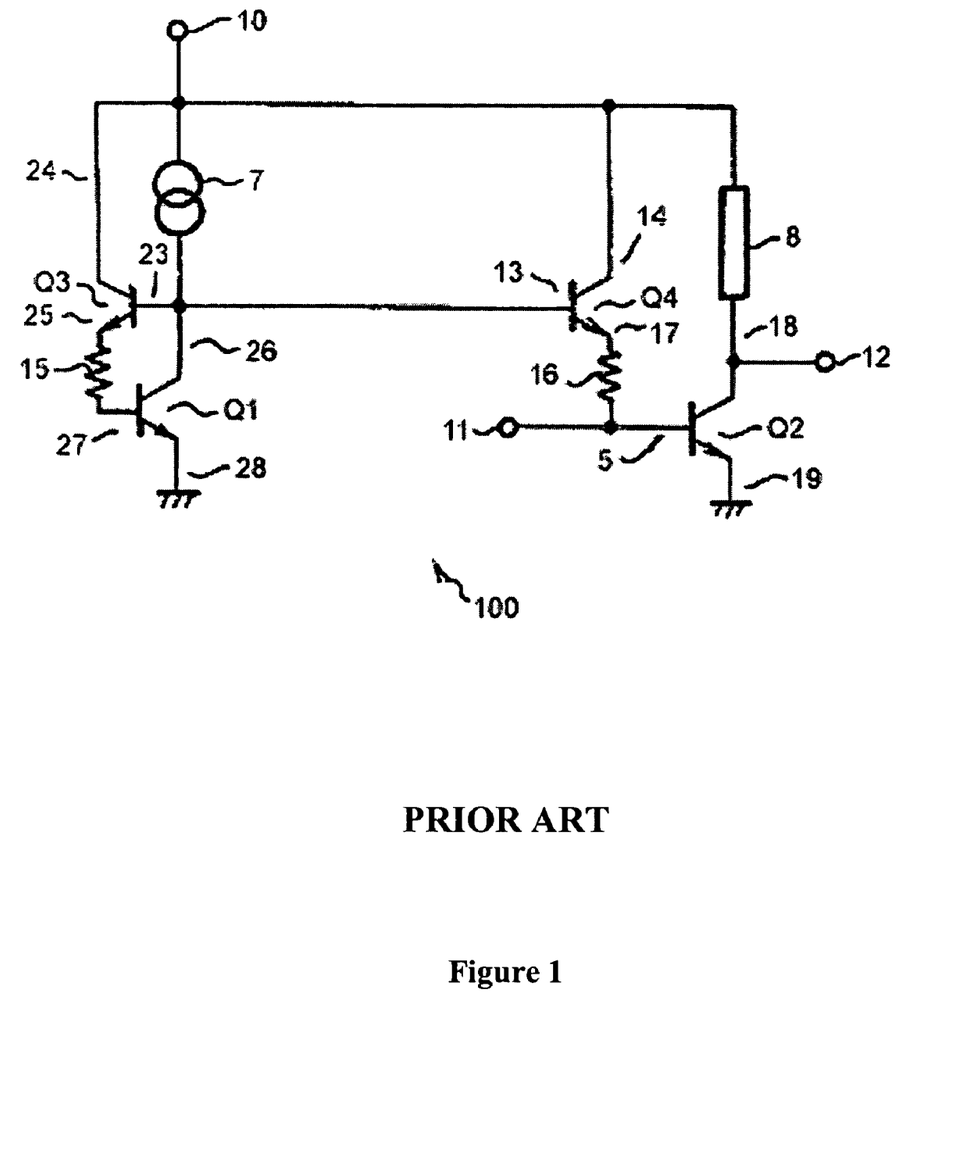
FIG. 1 is a circuit diagram of a prior art power amplifier with a current mirror bias circuit.

Current mirror biasing circuits allow for constant DC quiescent collector currents in power transistors. The DC quiescent collector current is the DC current flow into the collector of the transistor with no radio frequency (RF) signal applied to the base of the transistor. FIG. 1 illustrates a known current bias circuit 100 used in a mobile electronic device such as a cellular telephone (cell phone). As shown, the circuit contains a current mirror transistor Q1 a current mirror bias transistor Q3, an RF power amplifier transistor Q2, and a power amplifier bias transistor Q4. The emitter 28 of current mirror transistor Q1 is grounded and the collector 26 of current mirror transistor Q1 is connected to a power terminal 10 through a constant current source 7. The power terminal 10 is a terminal to which a power supply (not shown) is connected. The emitter 25 of the current mirror bias transistor Q3 is connected to the base 27 of the current mirror transistor Q1 through a base ballast resistor 15. The collector 24 of current mirror bias transistor Q3 is directly connected to the power terminal 10. The base 23 of current mirror bias transistor Q3 is connected to a connection point between the collector 26 of current mirror transistor Q1 and the constant current source 7. Also connected to this same connection point is the base 13 of the power amplifier bias transistor Q4. The collector 14 of the power amplifier bias transistor is directly connected to the power terminal 10, and its emitter 17 is connected to the base 5 of RF power amplifier transistor Q2 through a base resistor 16. The connection point between the base resistor 16 and the base 5 of the RF power amplifier transistor Q2 is connected to an RF input terminal 11. The collector 18 of the RF power amplifier transistor Q2 is connected to the power terminal 10 through load 8, and the emitter 19 is grounded. The output of the circuit is taken from a connection point 12 between the collector 18 of RF power amplifier transistor Q2 and load 8.

The amplification of an RF signal occurs at the RF power amplifier transistor Q2. The RF input signal is applied to the RF power transistor Q2 at an input terminal 11, and the RF output is available at the output terminal 12. A bias-voltage for the RF power transistor is generated by the circuit that includes a constant current source 7, a current mirror transistor Q1, a current mirror bias transistor Q3 and a base ballast resistor 15. The voltage developed at the collector 26 of the current mirror transistor Q1 biases the power amplifier bias transistor Q4 which in turn biases the RF power transistor Q2 through a base resistor 16. Power $V_{CC}$ to the overall circuit is supplied at terminal 10.

In the known art, the voltage drops across each of the mirroring elements should equal its counterpart. In other words, the base-emitter voltages $V_{BE2}$ and $V_{BE1}$ for the RF power transistor Q2 and the current mirror transistor Q1 will be equal; the voltage drop, $V_{R15}$ and $V_{R16}$, across resistor 15 and resistor 16 will be equal; and the base-emitter voltages, $V_{BE3}$ and $V_{BE4}$ for the current mirror bias transistor Q3 and the RF power transistor Q4, respectively, will be equal. Since the transistors are tied to the power terminal 10 in this embodiment, should the voltage at the power terminal 10 decrease, then the quiescent collector currents for the transistors will decrease as the bias currents decrease.

The quiescent collector current is linked to the power added efficiency (PAE) of the amplifier, the output power ($P_{OUT}$), the gain, the optimal output impedance match, and the reliability of the device. The power added efficiency is defined as the output power (the RF power at the fundamental frequency supplied at the output terminal 12) minus the input RF power at the fundamental frequency, divided by the DC power of the entire circuit. The RF power transistor Q2 should be biased below a certain collector current density to extend the lifetime of the device and to avoid damage to the transistor. The collector current density is the current through the collector divided by the area of the collector (i.e. current/unit area). Changes in the load 8 or the biasing conditions of the power transistor Q2 can alter the value of the impedance match present at the output terminal 12. This alteration in the impedance match causes the quiescent collector current density to rise to a level where the power transistor Q2 sustains catastrophic damage.

Although the quiescent collector current may remain constant as the collector supply voltage varies, the output power of the amplifier can vary with the voltage. Even if the voltage did not vary, the power of the transmitting device may need to be increased or decreased depending upon the application. For instance, where a mobile cell phone is continually moving and changing its distance from the base station, the power to maintain communication with the base station may need to increase as the distance increases between the base station and the cell phone. On the other hand, when the cell phone is closer to the base station, the output power may be reduced for the shorter-range communication. Therefore, there is a need for a current mirror bias circuit with the capability of providing an approximately constant quiescent collector current in the RF power transistor Q2 despite a changing voltage supplied to the power terminal 10, but yet provide a varying reference voltage to prompt changes in the collector current of the power transistor Q2 to meet the varying power requirements of the amplifier.

BRIEF SUMMARY

In one aspect of this invention, a constant reference voltage is provided for biasing a current mirror bias circuit that will maintain a constant collector current in a power transistor regardless of a varying collector supply voltage and provide an output power control by adjusting the reference voltage that is independent of the collector voltage for the power transistor. By using two separate voltage supplies, the high power-added efficiency of the power transistor is maintained since the reference voltage for the current mirror bias circuit controls the quiescent DC collector current in the power transistor at a fairly constant value across a wide range of collector voltages. The source of the reference voltage for the bias circuit may be a regulated voltage supply with a voltage lower than the minimum allowed operational voltage delivered by the battery. At this lower value, the reference voltage allows the power transistor to maintain a constant quiescent collector current as the RF power transistor drains the collector power source such as a battery. This is useful in devices such as cell phones where the use of the cell phone often drains the battery to a depleted state.

In an embodiment utilizing separate voltage supplies, the power amplifier's $V_{CC}$ supply can degrade to a low level without adversely impacting the quiescent collector current flowing through the power transistor. The reference voltage, supplied by a source separate from the $V_{CC}$ source, may not degrade as quickly as the $V_{CC}$ source supplying power for the power transistor thus allowing the reference voltage to remain constant for a longer period of time than the $V_{CC}$ source. With a constant reference voltage, the bias voltage and the base current for the power transistor will remain at a more constant value thus forcing the quiescent collector current of the power transistor to remain approximately constant over a wide range of $V_{CC}$ values.

As the charge in a battery powering the power amplifier decreases, subsequently $V_{CC}$ decreases, causing the output power of the power amplifier to decrease even though the collector current remains constant. By varying the reference voltage, one can increase the DC quiescent collector current to offset this decrease in the power output of the amplifier. Since the reference voltage can increase the DC quiescent collector current, it can be used to decrease it as well. Thus, the reference voltage may be used to control the overall power output of the power amplifier to adjust and control the output power in specific instances.

For example, as mobile cell phones vary in distance from a base station, it may become more difficult to communicate with a given base station. On the other hand, the power required to communicate long distances to a base station may not be necessary when the cell phone is in close proximity to the base station. Thus, the cell phone may change output power levels depending upon the proximity of the cell phone to the base station by varying the reference voltage and possibly extending the life of the cell phone battery when the base station is near by.

Typical output powers might range from +5 to +33 dBm for cell phones operating on the GSM850 (824 MHz to 849 MHz) and the GSM 900 (880 MHz to 915 MHz) frequency bands. Powers can range from 0 to +30 dBm for cell phones operating on the DCS (1710 MHz to 1785 MHz) and PCS (1850 MHz to 1910 MHz) frequency bands. These output powers are defined in the GSM technical specification document entitled 3GPP TS 45.005 V6.4.0.

BRIEF DESCRIPTION OF THE DRAWINGS

The invention can be better understood with reference to the following diagrams. The graphs and drawings are not necessarily to scale but instead place an emphasis upon the principles of the invention.

DETAILED DESCRIPTION OF THE DRAWINGS AND THE PRESENTLY PREFERRED EMBODIMENTS

In one aspect of this invention, a current mirror bias circuit is described that is capable of providing output power control in a power amplifier while maintaining a relatively constant quiescent collector current in the radio frequency ("RF") power transistor of the amplifier across a varying collector supply voltage $V_{CC}$. When the RF power amplifier is employed in a specific application such as a final transmitting amplifier in a GSM or CDMA handset or other mobile communication device, it may be difficult to maintain a specific $V_{CC}$ since it is provided by a battery source that is continually depleting. For example, the battery voltage may begin at about 4.2 volts when fully charged, but eventually it could drop to about 2.8 volts before the device shuts off due to a low battery supply, thus this range could typically define an operational range of collector supply voltages. A second power source supplying the reference voltage for the current mirror bias circuit mitigates this problem. By maintaining a constant voltage $V_{REF}$, the reference current $I_{REF}$ flowing as a function of the reference voltage $V_{REF}$ remains constant, thus the collector current $I_C$ for the power transistor will remain approximately constant over a variation in the power supply voltage $V_{CC}$ since the reference current $I_{REF}$ determines the collector current $I_C$ for the RF power transistor. By varying the reference voltage $V_{REF}$, changes may be made to the DC quiescent collector current $I_C$ flowing through the RF power transistor so that the output power either remains constant when the supply voltage fluctuates or it changes somewhat to meet varying demands. In both cases, the power-added efficiency may be maintained to provide clear communications. Once again, the DC quiescent current is defined as the DC current flowing through the transistor when there is no RF input signal applied.

Figure 2:
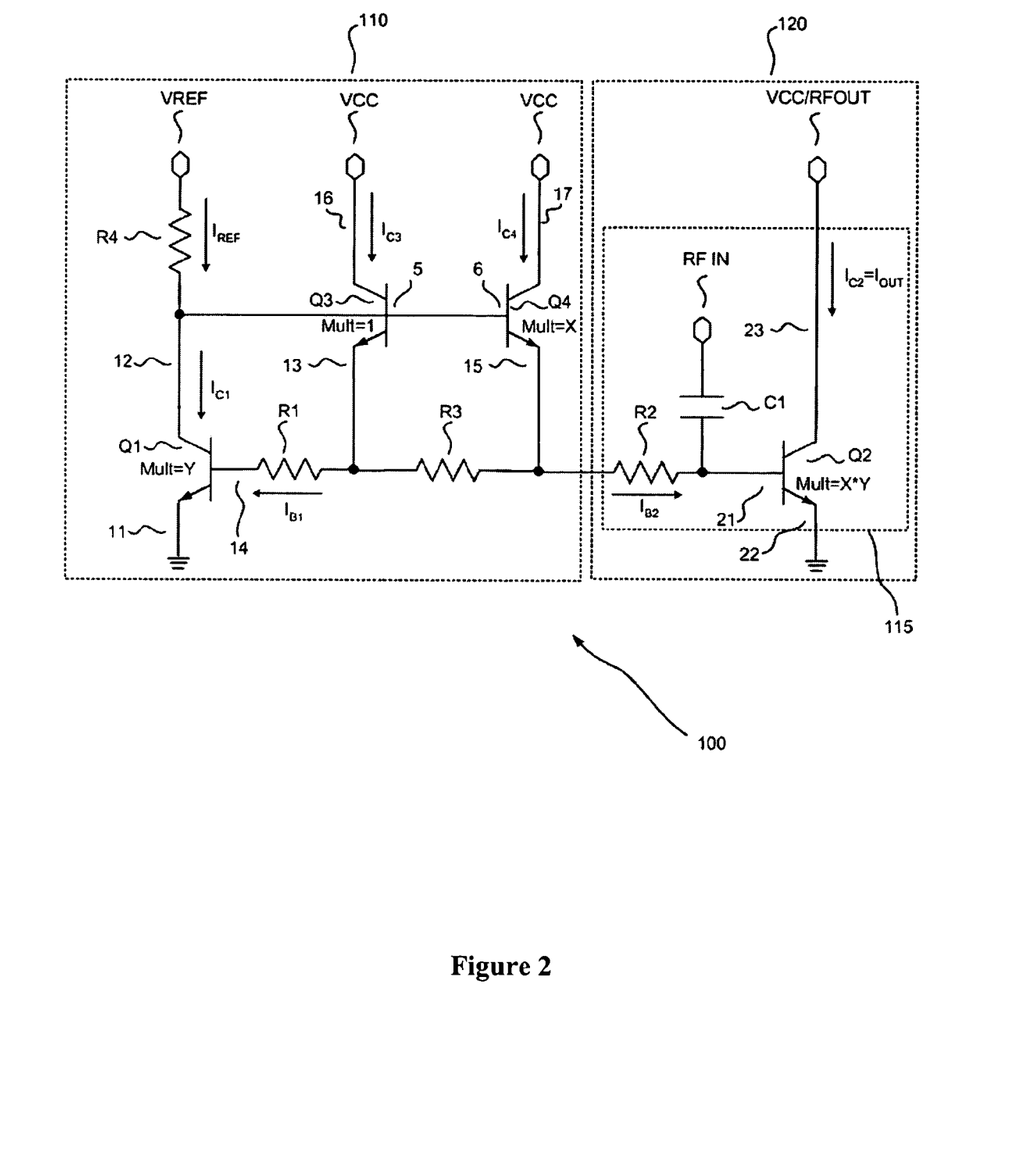
FIG. 2 is a circuit diagram of an embodiment of the power amplifier with a current mirror bias circuit.

FIG. 2 shows a circuit diagram of a current bias circuit 100 according to a first embodiment of the invention. As shown, the current bias circuit 100 contains a current mirror bias circuit 110 and an RF power amplifier circuit 120.

The current mirror bias circuit 110 contains a current mirror transistor Q1, a current mirror bias transistor Q3 and a power amplifier bias transistor Q4. The emitter 11 of current mirror transistor Q1 is grounded and the collector 12 is connected to a reference voltage ($V_{REF}$) through a current source resistor R4. The emitter 13 of current mirror bias transistor Q3 is connected to the base 14 of the current mirror transistor Q1 through base ballast resistor R1 and to the emitter 15 of power amplifier bias transistor Q4 through compensating resistor R3. The collector 16 of current mirror bias transistor Q3 and the collector 17 of the power amplifier bias transistor Q4 are directly connected to a power supply ($V_{CC}$). The base 5 of the current mirror bias transistor Q3 is connected to the collector 12 of current mirror transistor Q1 and the base 6 of power amplifier bias transistor Q4. The emitter 15 of power amplifier bias transistor Q4 is the output of the current mirror bias circuit 110, which is connected to the input of RF power amplifier circuit 120.

The output of the current mirror bias circuit 110 will supply the DC input to the RF power amplifier circuit 120 at the base 21 of an RF power amplifier transistor Q2 through a base ballast resistor R2. An RF input is applied to the base 21 of the RF power amplifier transistor Q2 through a DC-blocking capacitor C1. The emitter 22 of RF power amplifier transistor Q2 is grounded. The collector 23 of RF power amplifier transistor Q2 is directly connected to the power supply $V_{CC}$. The output of the power amplifier 110 is taken from the collector 23 of RF power amplifier transistor Q2 at $V_{CC}/RF_{OUT}$.

In the circuit diagram of FIG. 2, a changing collector voltage $V_{CC}$ does not significantly affect the DC or RF performance of the RF power transistor Q2 as long as $V_{REF}$ remains constant and $V_{CC}$ does not drop below a minimum value. In the known bias circuit shown in FIG. 1, a change in the voltage supplied to the power terminal 10 not only affects the collector-emitter voltage of the RF power transistor Q2, but it also changes the base bias current of the RF power transistor Q2. In order to maintain the proper power added efficiency, output power, gain and optimal impedance matching, the RF power transistor Q2 should be biased for the proper collector current. By providing a constant $V_{REF}$ as in FIG. 2, fluctuations in the power transistor Q2 collector current $I_C$ are largely avoided, and to ensure overall reliability of the power amplifier, the RF power transistor Q2 is biased below a certain collector current density through the control of $V_{REF}$. Since the embodiment of FIG. 2 allows for a controlled variation of $V_{REF}$, $V_{REF}$ may be varied to change the DC quiescent collector current of the RF power transistor Q1 to offset changes in $V_{CC}$ or to vary the output power of the power amplifier.

In an embodiment of the invention, both the current mirror bias circuit 110 and the power amplifier 120 are disposed on the same die, with each taking up a particular amount of area on the die. The operating area of a transistor, as defined earlier, is that area of the collector through which the current flows. The quiescent collector current density of a transistor is defined by the total current flowing through the transistor divided by the area of the collector (i.e. current/unit area). In this embodiment, the collector area of the individual transistors are proportioned so that the transistors may operate with the same quiescent DC collector current densities in order to minimize variations due to junction temperature in the bipolar transistors. These transistors may be, for example, heterojunction bipolar transistors (HBTs) formed on an InP substrate. InP provides a low thermal resistance in comparison to many other electronic device materials. In high power applications, the heat should transfer away from the InP HBTs more effectively in comparison with most semiconductor materials, thus preventing current collapse in the HBT.

Although HBTs are commonly used for high power applications in compound semiconductors, the invention is not limited to this transistor design. Further, the embodiment of the invention is not limited to InP-based materials and may utilize other semiconductor materials such as GaAs, GaN, SiC and SiGe.

Figure 3:
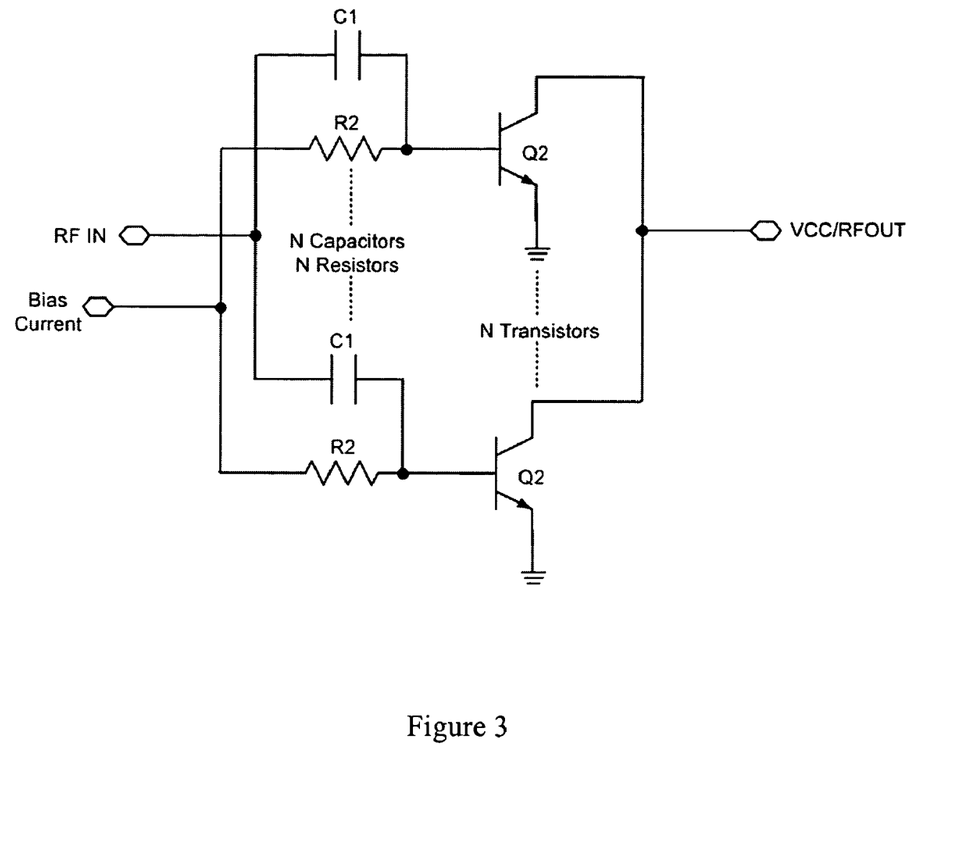
FIG. 3 is a circuit diagram of an embodiment of the parallel connection between power amplifier cells.

Typically, an HBT power amplifier is composed of multiple unit cells. FIG. 3 shows a parallel combination of the cells, each cell comprising the elements of the RF power amplifier 115 of FIG. 2 and are connected in the same manner. Each parallel cell in FIG. 3 includes the RF power transistor Q2, the base ballast resistor R2 for DC biasing the RF power transistor Q2 and the shunt capacitor used as a DC block for the RF power transistor Q2. Further, FIG. 3 shows a parallel connection to the bias current input to each of the RF power transistor base ballast resistors R2N, the parallel RF to the shunt capacitors C1N and the parallel $V_{CC}/RF_{OUT}$ from each of the parallel RF power transistors Q2N. The current mirror bias circuit 110 in FIG. 2 may bias one or more of these parallel unit cells 115 that make up the RF power amplifier 120. When formed from unit cells the RF power amplifier can handle large amounts of current for delivering the appropriate amount of RF power to an antenna.

In an embodiment of the power amplifier-current mirror bias circuit, the combination of transistors Q1, Q2, Q3, and Q4 are sized such that the DC quiescent current density of the current mirror transistor Q1 and the RF power transistor Q2 are equal ($J_{C1}=J_{C2}$) and that the DC quiescent current density of the current mirror bias transistor Q3 and the power amplifier bias transistor Q4 are also equal ($J_{C3}=J_{C4}$). Subsequently, if the DC quiescent current densities $J_C$ of these transistors are equal, then in the DC quiescent state, the base-emitter voltages will be equal as well ($V_{BE1}=V_{BE2}$, $V_{BE3}=V_{BE4}$). As shown below, when $V_{BE1}=V_{BE2}$ and $V_{BE3}=V_{BE4}$, then the current mirror base ballast resistor R1 and the RF power transistor base ballast resistor R2 are sized to develop the voltage drops $V_{R1}$ and $V_{R2}$ so that they are equal and the following relationships apply:

$$V_{BE1}+V_{R1}+V_{BE3}=V_{BE2}+V_{R2}+V_{BE4} \quad [1]$$

$$V_{BE1}=V_{BE2}, V_{BE3}=V_{BE4} \quad [2]$$

$$V_{R1}=V_{R2} \quad [3]$$

The RF power transistor Q2 is designed to mirror a collector current approximately equal to a current that is X times greater than the collector current of the current mirror transistor Q1. The power amplifier bias transistor Q4 mirrors a collector current that is X times greater than the collector current in the current mirror bias transistor Q3. If the transistors are HBTs, in the following analysis it is assumed that the current gain β is equal for all of the HBTs, that the output impedance $r_o$ of the HBTs is infinite, that the self-heating effects of the HBTs are neglected, that the HBTs are in close proximity to one another (so that they are at the same temperature) on the die, and that the emitter voltages of HBTs Q3 and Q4 are approximately equal so that no current flows through a temperature compensating resistor R3. Then the collector currents $I_C$ for the HBTs are determined from the following formulas:

$$I_{C1} = Y \cdot I_{S1} e^{\left(\frac{V_{BE1}}{V_T}-1\right)} \quad [4]$$

$$I_{C2} = X \cdot Y \cdot I_{S2} e^{\left(\frac{V_{BE2}}{V_T}-1\right)} \quad [5]$$

$$I_{C3} = I_{S3} e^{\left(\frac{V_{BE3}}{V_T}-1\right)} \quad [6]$$

$$I_{C4} = X \cdot I_{S4} e^{\left(\frac{V_{BE4}}{V_T}-1\right)} \quad [7]$$

Since the transistors are fabricated using the same process and formed on the same die, the saturation currents are equal to one another, therefore $I_{S1}=I_{S2}=I_{S3}=I_{S4}=I_S$. Then it follows that the relationship between $I_{C1}$ and $I_{C2}$ and the relationship between $I_{C3}$ and $I_{C4}$ are determined as follows:

$$I_{C1} = Y \cdot I_S e^{\left(\frac{V_{BE1,2}}{V_T}-1\right)} \quad [7]$$

$$I_{C2} = X \cdot Y \cdot I_S e^{\left(\frac{V_{BE1,2}}{V_T}-1\right)} \quad [8]$$

$$I_{C3} = I_S e^{\left(\frac{V_{BE3,4}}{V_T}-1\right)} \quad [9]$$

$$I_{C4} = X \cdot I_S e^{\left(\frac{V_{BE3,4}}{V_T}-1\right)} \quad [10]$$

-continued $$I_S e^{\left(\frac{V_{BE1,2}}{V_T} - 1\right)} = \frac{I_{C1}}{Y} = \frac{I_{C2}}{X \cdot Y} \Rightarrow X \cdot I_{C1} = I_{C2} \quad [11]$$

$$I_S e^{\left(\frac{V_{BE3,4}}{V_T} - 1\right)} = I_{C3} = \frac{I_{C4}}{X} \Rightarrow X \cdot I_{C3} = I_{C4} \quad [12]$$

Thus, as shown by the relationships of Equations 11 and 12, the collector currents vary by a factor of X.

As discussed previously, it was shown that $V_{R1}=V_{R2}$. The design constraint for resistor R1 and resistor R2 in order to develop the appropriate voltage drop is shown by the following analysis:

$$V_{R1} = V_{R2} \quad [13]$$

$$I_{B1}R_1 = I_{B2}R_2 \quad [14]$$

$$\frac{I_{C1}}{\beta}R_1 = \frac{I_{C2}}{\beta}R_2 \quad [15]$$

$$\frac{I_{C1}}{\beta}R_1 = X\frac{I_{C1}}{\beta}R_2 \quad [16]$$

$$R_1 = X \cdot R_2 \quad [17]$$

Therefore, the ratio of the resistances for the resistors R1 and R2 is also a factor of X.

The current source resistor R4 determines the reference current $I_{REF}$ in conjunction with the reference voltage $V_{REF}$. The reference current $I_{REF}$ is determined from the following formulation:

$$I_{REF} = \frac{V_{REF} - V_{BE1} - V_{R1} - V_{BE3}}{R_4} \quad [18]$$

$I_{REF}$ also determines the bias voltage that is applied to the base 5 of the current mirror bias transistor Q3 and the base 6 of the power amplifier bias transistor Q4 in FIG. 2. In this embodiment, both bias voltages should be equal. In such an embodiment, the bias voltage may be applied to the power amplifier bias transistor Q4 and the current mirror bias transistor in a parallel arrangement.

In an embodiment where $\beta$ is very large ($\beta$>50), then one may assume that $I_{C1} \approx I_{REF}$. Further, $I_{REF}$ can be considered to be reflected in the collector current of the power transistor Q2 and $I_{C2}=X \cdot I_{REF}$. Otherwise:

$$I_{REF} = I_{C1} + \frac{I_{C1}}{\beta(\beta+1)} + \frac{I_{C2}}{\beta(\beta+1)} \quad [19]$$

$$= I_{C1} + \frac{I_{C2}}{\beta(\beta+1)} + \frac{X \cdot I_{C1}}{\beta(\beta+1)}$$

$$I_{C1} = \frac{I_{REF}}{1 + \frac{1+X}{\beta(\beta+1)}} \quad [20]$$

$$I_{C2} = X \cdot I_{C1} = \frac{X \cdot I_{REF}}{1 + \frac{1+X}{\beta(\beta+1)}} \quad [21]$$

In another embodiment, a compensating resistor R3, as shown in FIG. 2, is supplied that will allow leakage currents to flow between the emitters of the current mirror bias transistor Q3 and the power amplifier bias transistor Q4 to keep the potentials even should the base-emitter voltages become mismatched. Heat is one common cause of a voltage mismatch. For instance, the base-emitter voltage of high-current transistors, such as the HBTs that are found in power amplifiers, may decrease as the junction temperature rises by 1 to 2 mV/° C. This can be problematic when the devices are formed in a multi-cell transistor configuration. When in close proximity to other transistors, a transistor's junction temperature may rise not only from self-heating but also from the heating that occurs in the surrounding transistors. In a multi-cell power amplifier gain-stage, the current density is ideally equal in all of the transistors, thus the transistors' junction temperatures rise at the same rate as the current density increases. However, the temperature of the transistors is usually higher towards the center of the multi-cell array, which means that the devices located at the edge of the array may dissipate heat rapidly to cooler surroundings. In an embodiment where the transistors are formed on an InP substrate, the low thermal resistance of the InP material allows for a more efficient heat removal through the InP material, thus reducing the impact of the temperature compensating resistor R3.

The combination of transistors Q1, Q2, Q3, and Q4 forming the power amplifier and the current mirror bias circuit are assigned multiplicity factors based on the operating area of the transistor, and, as reflected in FIG. 2, the current mirror bias transistor Q3 has a multiplicity factor of 1. This means that the current mirror bias transistor Q3 is the smallest unit-cell transistor in the current mirror bias circuit. The multiplicity factors X and Y are generally equal to or greater than 1 and they represent the ratios of the areas of the power transistor Q2, the current mirror transistor Q1 and the power bias transistor Q4 as compared to the current mirror bias transistor Q3. For each comparison, the area may be realized by either an individual transistor area or size, or by the combined area of the related transistors that operate together in parallel.

Figure 4:
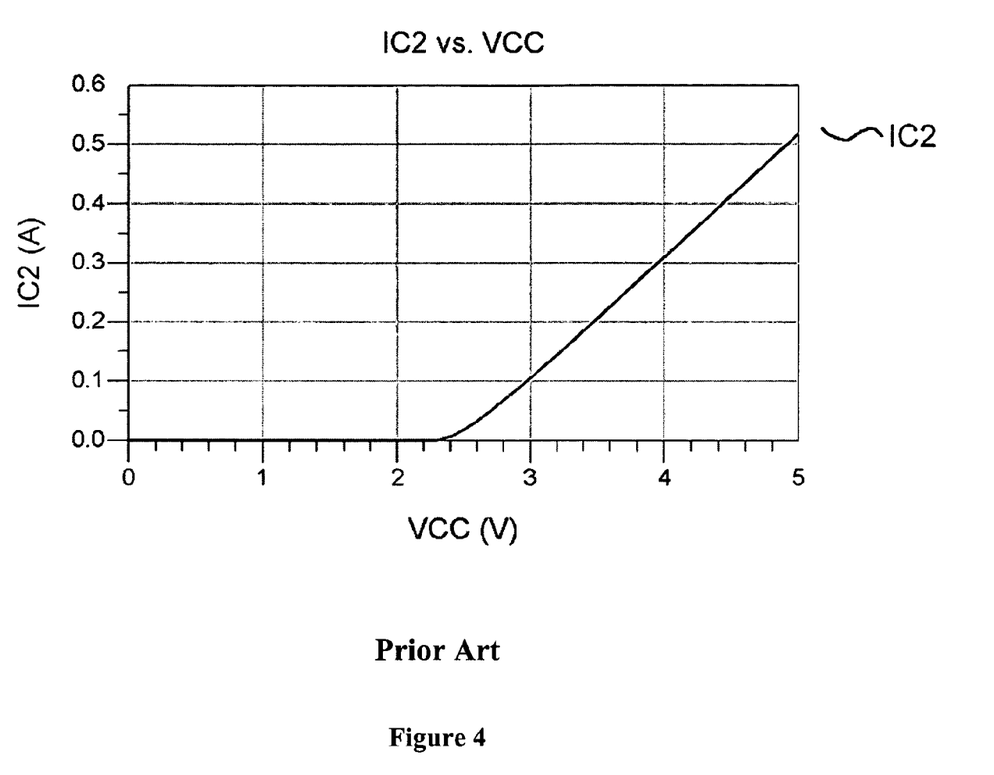
FIG. 4 is a graph showing the relationship between the variation of collector current with a variation in collector voltage in a prior art circuit.
Figure 5:
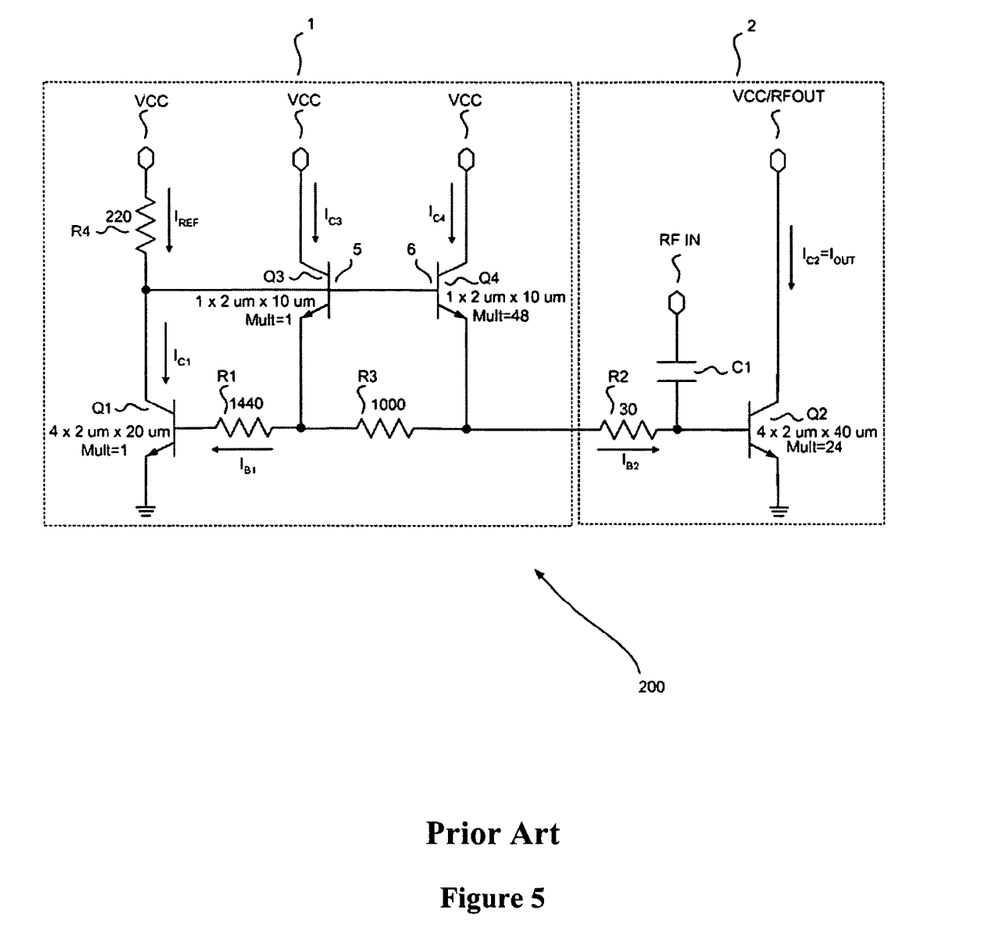
FIG. 5 is a circuit diagram of a power amplifier with a current mirror bias circuit employing one power supply.

As discussed earlier, changes in the reference voltage or the supply voltage that might determine the bias current can adversely affect the quiescent collector current. FIG. 4 shows a graph of the collector current ($I_{C2}$) for an RF power transistor as a function of the supply voltage $V_{CC}$ when only one power supply determines the reference voltage $V_{REF}$ and collector supply voltage $V_{CC}$. In this prior art embodiment, for which the overall current bias circuit 200 is shown in FIG. 5, the power supply provides the voltage $V_{CC}$ to the collectors of all transistors making up the current bias circuit and the power amplifier. The output collector current is negligible until a particular power supply voltage ($V_{CC}$) is applied, as shown about 2.4 V, and then rises approximately linearly with an increase in the power supply voltage.

A current bias circuit 200 illustrated in FIG. 5 is closely related to the prior art circuit of FIG. 1. In addition, the current bias circuit 200 shown in FIG. 5 is similar to the arrangement of the amplifier 100 shown in FIG. 2 with the exception that the collector of current mirror transistor Q1 is connected to the power supply $V_{CC}$ through the current source resistor R4 rather than the reference voltage $V_{REF}$. Accordingly, as the arrangement of FIG. 5 and FIG. 2 is essentially the same, an explanation of the circuit shown and the various interconnections is not re-presented. The values for the resistors and the transistor relative operating areas for this simulation are also indicated in FIG. 5.

More specifically, and as shown in FIG. 4, the collector current $I_{C2}$ of power transistor Q2 varies from 110 mA to 520 mA as $V_{CC}$ varies between 3 and 5 volts. This graph demonstrates that the collector current varies dramatically if the voltage supplied to the collector of power transistor Q2 changes. This variation in the RF power transistor Q2 quiescent collector current results from the variation of the current $I_{REF}$, as calculated by Equation 18, caused by the variation in voltage $V_{CC}$ (which here is the same as changing the reference voltage $V_{REF}$). The variation in the current $I_{REF}$ of Equation 18 is then mirrored in $I_{C2}$ as calculated by Equation 21.

Figure 6:
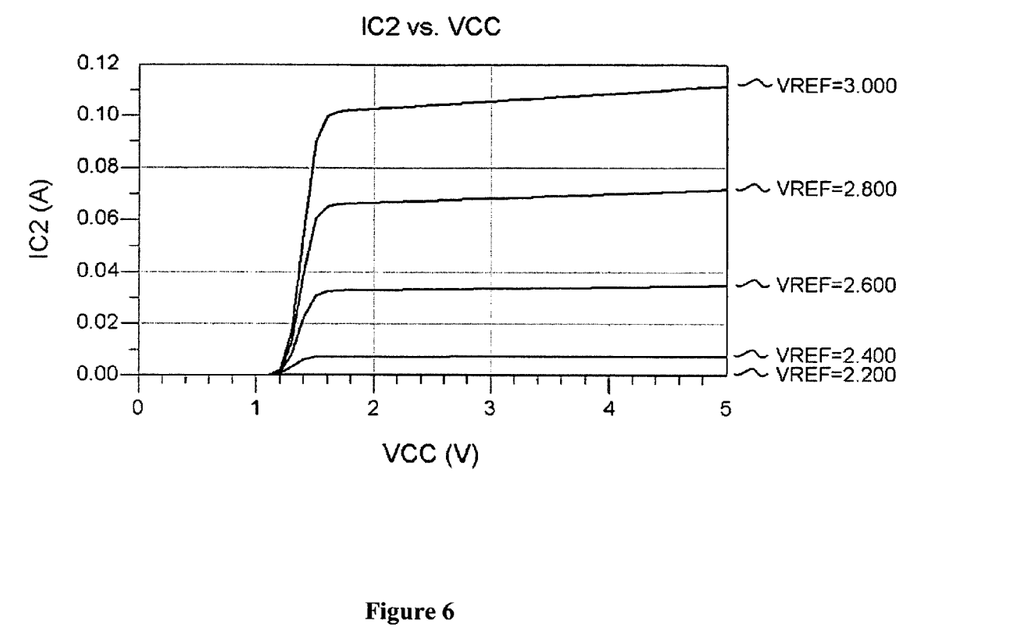
FIG. 6 is a graph illustrating the various power transistor collector currents for various reference voltages.
Figure 7:
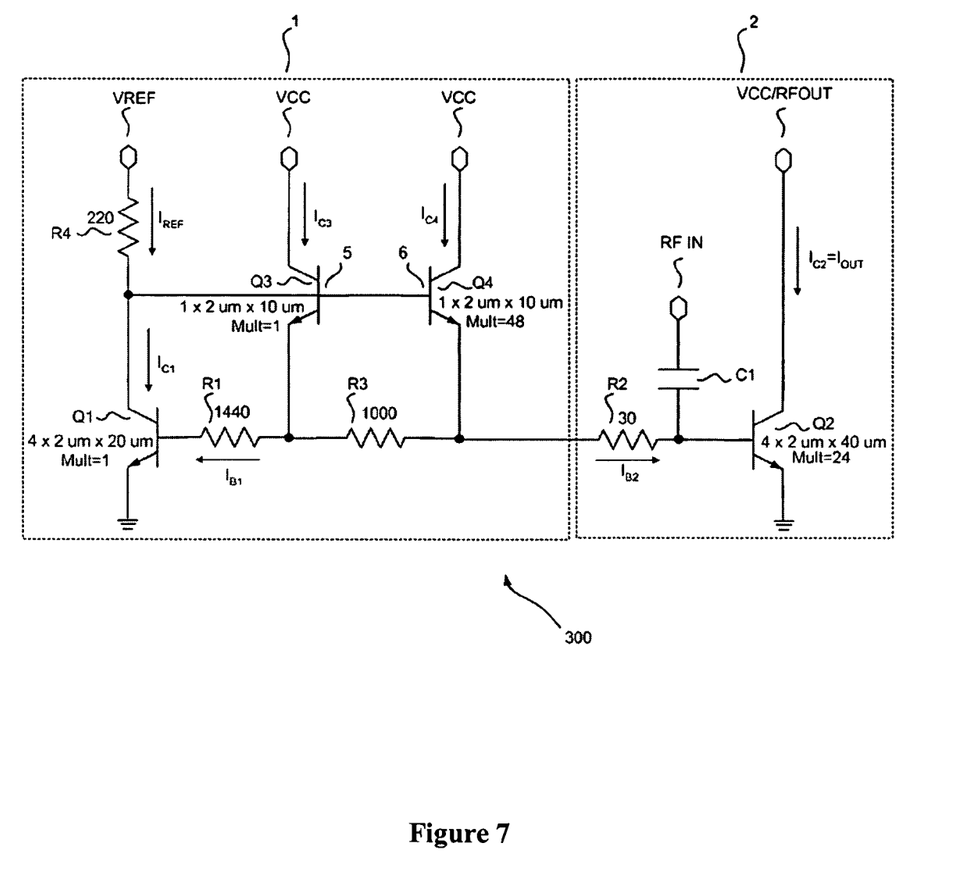
FIG. 7 is a circuit diagram of the power amplifier with a current mirror bias circuit employing two power supplies.

FIG. 6 illustrates a graph of the collector current $I_{C2}$ for the RF power amplifier transistor shown in FIG. 2 as a function of the variation in the supply voltage $V_{CC}$ where the reference voltage $V_{REF}$ is maintained at a constant value for five different $V_{REF}$ voltages. This scenario depicts an embodiment where two independent power supplies are employed. The values for the collector current and voltages reflected in the graph of FIG. 6 are applied to the circuit elements of FIG. 7. The circuit of FIG. 7 is the same as the circuit of FIG. 2, however, the circuit elements of FIG. 2 now have been defined by assigning values to them. A description regarding the connection of the various elements is not re-presented.

As shown in FIG. 6, if $V_{CC}$ varies from 3 to 5 volts with a constant $I_{REF}$ of 3 volts, $I_{C2}$ remains approximately constant over that range as it minimally changes from 106 to 112 mA. This result is achieved because reference current $I_{REF}$ changes minimally, if at all, since the reference voltage $V_{REF}$ remains constant. Thus the power transistor Q2 collector current $I_{C2}$ of FIG. 7 remains relatively constant across this voltage $V_{CC}$ range because $I_{REF}$ remains fixed. The lack in variation in the collector current of FIG. 6 where the supply voltage $V_{CC}$ increases and the reference voltage remains fixed, means that the collector current may not increase to a point where the power amplifier will self-destruct due to large increases in collector voltage until the collector-emitter breakdown voltage is increased.

In another embodiment of the invention, the reference voltage $V_{REF}$ is used as a power control for the RF power amplifier. As shown in FIG. 7, the collector current flowing through the power transistor Q2 may be controlled directly by the voltage of $V_{REF}$. FIG. 6, shows that the reference voltage may be set to any voltage in a control range between 2.2 and 3 volts for a fixed $V_{CC}$ of 4 volts, and the DC collector current $I_{CC}$ for the RF power transistor will vary anywhere between 0 to 110 mA in this range of reference voltages, respectively. If the power supply supplying the reference voltage is designed to operate at a value less than the lower end of the operational range of battery voltages as the above example shows, then the reference voltage has the capability to remain constant for a period longer than the battery is capable of supplying a voltage above the lower end of the operational range of voltages. This is especially true, where the operational range for the battery is typically defined as being about 2.8–4.2 Volts.

Utilizing the fact that the collector current $I_C$ may vary in response to a variation in the reference current $I_{REF}$ may allow one the ability to set, select or vary the reference voltage $V_{REF}$ in order to change the output power delivered by the power amplifier. Further, when $V_{REF}$ approaches the lower end of the control range, for example, less than 0.8 volts, the circuit as a whole dissipates less than several microamps since the reference current $I_{REF}$ essentially falls to zero. Thus when the power amplifier is not needed, $V_{REF}$ may be utilized to turn-off the power amplifier to minimize the power consumption of a cell phone or other portable transmission device.

An application of an embodiment for varying the transmission power of a power amplifier may be found when cell phones or personal digital devices communicate with cellular towers at distances that might vary from one transmission to the next. Cell phones that are in close proximity to the base station require less transmitting power from the cell phone to effectively communicate with the base station as opposed to those mobile devices that are further from the base station. It is advantageous if the cell phone can vary the output power at which it transmits in order to possibly conserve the available energy in a cell phone battery. By varying the reference voltage as described previously, a cell phone or PDA can achieve such a result.

Figure 8:
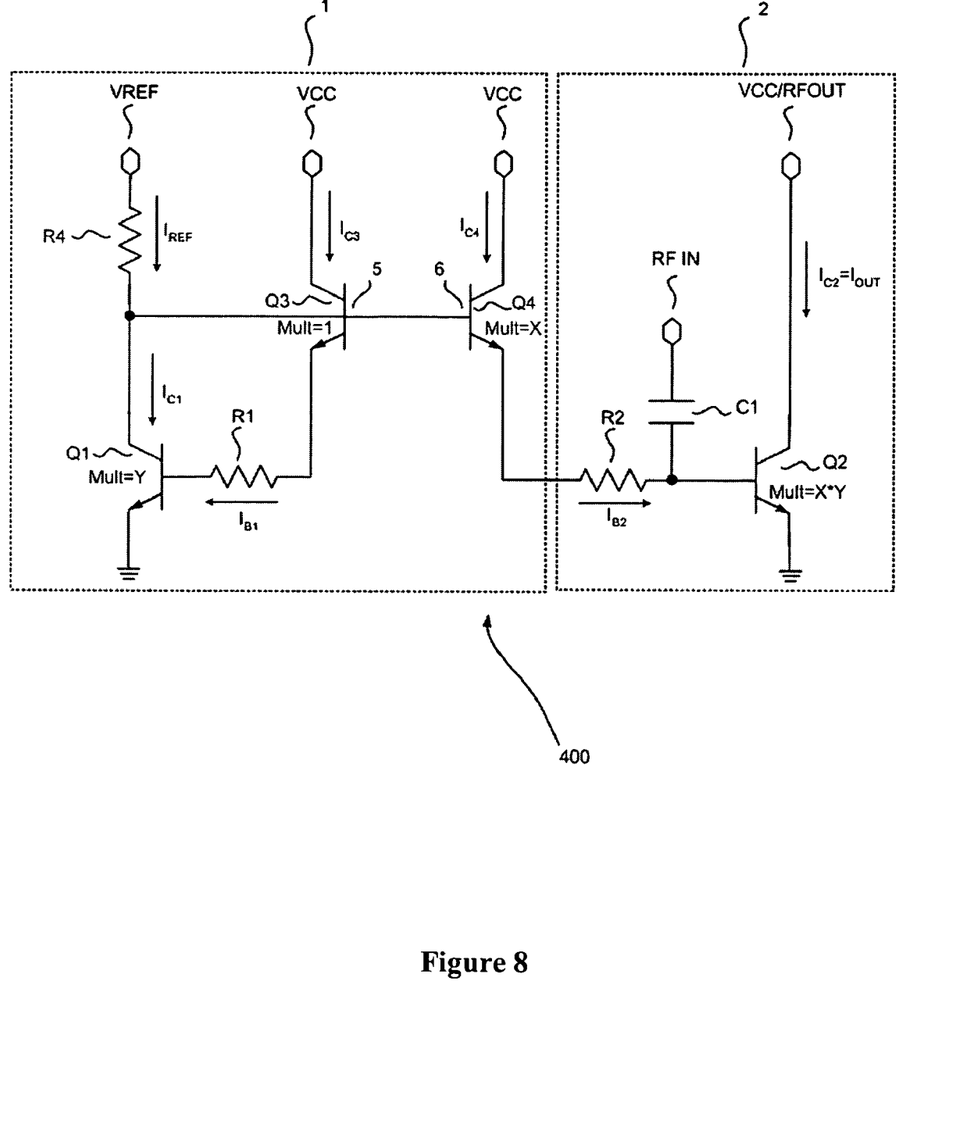
FIG. 8 is a circuit diagram of the power amplifier with a current mirror bias circuit without a temperature compensation resistor.

Further, in an alternative embodiment of the current bias circuit 400 as shown in FIG. 8, the compensating resistor R3 may be removed from the circuit shown in FIG. 2. Accordingly, as the difference between this embodiment and that of FIG. 2 is that the emitters of current mirror bias transistor Q3 and power amplifier bias transistor Q4 are no longer connected, while the connections between the other components remain the same, further description of the various circuit elements in FIG. 8 will be omitted. An advantage available with this embodiment is the elimination of an unnecessary resistor that potentially uses otherwise valuable substrate real estate. This is especially true when the current mirror bias circuit is incorporated with the power amplifier on an InP substrate. One advantage of using InP is the rapid removal of heat from the junction of the transistors, thus the low thermal resistance of InP may allow for the removal of this compensating resistor R3.

The current mirror bias circuit for a power amplifier is described in which using at least one additional reference voltage allows for a variation of the output power by changing the quiescent collector current of the RF power amplifier transistor. By separating the source for the reference voltage from the $V_{CC}$ power supply, the reference voltage remains approximately constant for variations in the $V_{CC}$ power supply over an operational range of voltages and generally for a period longer than the battery holds its voltage within the operational range of voltages. This permits the ability to maintain a higher power-added efficiency for portable battery-operated RF devices that are subject to depleted batteries.

It is therefore intended that the foregoing detailed description be regarded as illustrative rather than limiting, and that it be understood that it is the following claims, including all equivalents, that are intended to define the spirit and scope of this invention.

We claim:

1. An electronic circuit comprising:
a power amplifier having a radio frequency ("RF") power transistor for amplifying radio frequency signals such that a quiescent DC collector current in the RF power transistor is approximately constant over an operational range of collector voltages supplied from a collector power supply;
a power amplifier bias transistor that biases the RF power transistor;
a current mirror bias transistor having an operating area such that the current mirror bias transistor has substantially a same current density as the power amplifier bias transistor when the current mirror bias transistor and the power amplifier bias transistor are biased from a reference voltage supply that supplies a reference voltage controlling an output power of the power amplifier and remains approximately constant as the collector voltage varies through the operational range;

a current mirror transistor biased by emitter current from the current mirror bias transistor and having an operating area such that a quiescent DC collector current density is about equal to a quiescent DC current density of the RF power transistor; and a first base ballast resistor and a second base ballast resistor, the first base ballast resistor placed between an emitter of the current mirror bias transistor and a base of the current mirror transistor and having a resistance for a voltage drop that is about equal to a voltage drop across the second base ballast resistor placed between an emitter of the power amplifier bias transistor and a base of the RF power transistor.

2. The electronic circuit as recited in claim 1, wherein the RF power transistor, the power amplifier bias transistor, the current mirror transistor and the current mirror bias transistor are formed on the same die.

3. The electronic circuit as recited in claim 1, wherein the reference voltage is set to any voltage within a control range of voltages.

4. The electronic circuit as recited in claim 3, wherein the control range of voltages controls the output power of the power amplifier.

5. The electronic circuit as recited in claim 1, wherein the current mirror bias transistor and the power amplifier bias transistor are biased in parallel to one another.

6. The electronic circuit as recited in claim 1, wherein an operating area of the power amplifier bias transistor is a multiple of the operating area of the current mirror bias transistor.

7. The electronic circuit as recited in claim 1, wherein an operating area of the RF power transistor is a multiple of an operating area of the current mirror transistor.

8. The electronic circuit as recited in claim 1, further comprising a temperature compensation resistor connecting a point between the emitter of the power amplifier bias transistor and the second base ballast resistor and a point between the emitter of the current mirror bias transistor and the first base ballast resistor.

9. The electronic circuit as recited in claim 1, where the quiescent DC collector current densities are about equal in the RF power transistor, the current mirror transistor, the power amplifier bias transistor and the current mirror bias transistor.

10. An electronic circuit comprising:

a power amplifier including a radio frequency ("RF") power transistor for amplifying radio frequency signals such that a quiescent DC collector current of the RF power transistor is approximately constant over an operational range of supply voltage from a collector power supply;

a power amplifier bias transistor that biases the RF power transistor;

a current mirror transistor that mirrors the quiescent DC collector current in the RF power transistor;

a current mirror bias transistor for establishing a reference current that flows as a collector current in the current mirror; and a first base ballast resistor and a second base ballast resistor, the first base ballast resistor placed between an emitter of the current mirror bias transistor and a base of the current mirror transistor and having a resistance for a voltage drop that is about equal to a voltage drop across the second base ballast resistor placed between an emitter of the power amplifier bias transistor and a base of the RF power transistor, wherein the current mirror bias transistor and the power amplifier bias transistor are adapted to be biased from a reference voltage sourced from a power supply supplying a set reference voltage within a control range of voltages, and the set reference voltage remains approximately constant over the operational range of the supply voltage from the collector power supply.

11. The electronic circuit as recited in claim 10, wherein the set reference voltage is selected for controlling an output power of the power amplifier cell.

12. The electronic circuit as recited in claim 10, wherein the quiescent DC collector current densities are approximately equal in the RF power transistor, the power amplifier bias transistor, the current mirror transistor and the current mirror bias transistor.

13. An electronic circuit comprising:

a radio frequency ("RF") power amplifier including at least one power transistor element for amplifying radio frequency signals at varying power levels such that a DC quiescent collector current for the RF power transistor is approximately constant over an operational range of collector voltages for a selected reference voltage;

a power amplifier bias transistor for biasing the power transistor;

a current mirror transistor that mirrors a DC quiescent collector current in the RF power transistor;

a current mirror bias transistor for biasing the current mirror transistor, the current mirror bias transistor and the power amplifier bias transistor are adapted to be biased from a reference voltage sourced from a power supply separate from a power supply supplying the collector voltage for the RF power transistor, the reference supply voltage remaining about constant at the selected reference voltage over an operational range of collector; and a first base ballast resistor and a second base ballast resistor, the first base ballast resistor placed between an emitter of the current mirror bias transistor and a base of the current mirror transistor and having a resistance for a voltage drop that is about equal to a voltage drop across the second base ballast resistor placed between an emitter of the power amplifier bias transistor and a base of the RF power transistor.

14. The electronic circuit recited in claim 13, wherein the selected reference voltage is selected within a control range of values to vary the output power of the power amplifier.

* * * * *